US007242996B2

(12) United States Patent
Roesner

(10) Patent No.: US 7,242,996 B2
(45) Date of Patent: Jul. 10, 2007

(54) ATTACHMENT OF RFID MODULES TO ANTENNAS

(75) Inventor: Bruce B. Roesner, San Diego, CA (US)

(73) Assignee: ID Solutions, Inc., Tapei (TW)

(*) Notice: Subject to any disclaimer, the term of this patent is extended or adjusted under 35 U.S.C. 154(b) by 514 days.

(21) Appl. No.: 10/692,497

(22) Filed: Oct. 24, 2003

(65) Prior Publication Data

US 2004/0215350 A1    Oct. 28, 2004

Related U.S. Application Data

(63) Continuation-in-part of application No. 10/396,932, filed on Mar. 25, 2003, now Pat. No. 6,982,190.

(51) Int. Cl.
G06F 19/00 (2006.01)
(52) U.S. Cl. .............. 700/117; 700/108; 156/264; 156/299
(58) Field of Classification Search .............. 700/117, 700/108–110; 156/264, 299, 555, 302, 556; 340/572.8, 572.1
See application file for complete search history.

(56) References Cited

U.S. PATENT DOCUMENTS

| 6,100,804 | A | 8/2000 | Brady et al. | |
| 6,375,780 | B1 | 4/2002 | Tuttle et al. | |
| 6,677,852 | B1 | 1/2004 | Landt | |
| 6,951,596 | B2* | 10/2005 | Green et al. | 156/264 |
| 2002/0195195 | A1 | 12/2002 | Grubau et al. | |
| 2003/0136503 | A1 | 7/2003 | Green et al. | |
| 2004/0089408 | A1* | 5/2004 | Brod et al. | 156/230 |
| 2005/0252605 | A1* | 11/2005 | Green et al. | 156/264 |

* cited by examiner

Primary Examiner—Zoila Cabrera
(74) Attorney, Agent, or Firm—Fish & Richardson P.C.

(57) ABSTRACT

Systems and techniques to assemble RFID tag can be employed in a manufacturing endeavor. An RFID tag assembling system includes an RFID module conveyor that moves a first substrate having multiple RFID modules, an RFID antenna conveyor that moves a second substrate having multiple RFID antennas with respect to and into alignment with the first substrate, and a joiner in proximity to the first substrate to separate the RFID modules from the first substrate and attach the RFID modules to the RFID antennas on the second substrate. The substrates can be reel-form substrates, and RFID tags can be formed in parallel. The system can also include an RFID module tester, and the RFID modules can be tested in parallel.

24 Claims, 8 Drawing Sheets

ATTACHMENT OF RFID MODULES TO ANTENNAS

CROSS REFERENCE TO RELATED APPLICATIONS

This application is a continuation-in-part application of, and claims the benefit of priority (under 35 USC 120) to, the U.S. patent application entitled, "CHIP ATTACHMENT IN AN RFID TAG", application Ser. No. 10/396,932, filed Mar. 25, 2003, now issued U.S. Pat. No. 6,982,190.

BACKGROUND

The present application describes systems and techniques relating to radio frequency identification (RFID) tag assembly, for example, attachment of an RFID module to an antenna.

In the manufacture of RFID tags, one of the more costly aspects is the attachment of RFID chips to the antennas. RFID chips have been put into RFID modules that can be tested before being attached to the antennas, but the assembly process conventionally involves multiple separate processes, such as testing of the modules in sheet form, cutting of the modules, and then hand picking the good modules from a sheet and applying them to a reel of antennas.

SUMMARY

The present disclosure includes systems and techniques relating to RFID tag assembly. According to an aspect, an RFID tag assembling system includes an RFID module conveyor that moves a first substrate having multiple RFID modules, an RFID antenna conveyor that moves a second substrate having multiple RFID antennas with respect to and into alignment with the first substrate, and a joiner in proximity to the first substrate to separate the RFID modules from the first substrate and attach the RFID modules to the RFID antennas on the second substrate. The substrates can be reel-form substrates, and RFID tags can be formed in parallel. The system can also include an RFID module tester, and the RFID modules can be tested in parallel.

One or more of the following advantages may be provided. The systems and techniques described may result in reduced costs to manufacture RFID tags, reduced complexity in RFID tag assembly, and increased throughput. Equipment costs can be reduced and operational speed can be improved by using one processing direction (i.e., reel-form substrates for the RFID modules and antennas) rather than table motion in both the X and Y directions. RFID modules can be tested just prior to attachment to the antennas, assuring that only fully functional modules are utilized.

RFID chips, which can be multifunctional and programmable, can be stored in module form on reels, and different size RFID antennas can be stored on separate reels. Customers, including those with very specific RFID applications, can be provided RFID tags on demand while at the same time maintaining minimal inventory, because the RFID tags can be assembled rapidly from existing inventory on reels. Moreover, testing need not be done until just before the RFID modules are attached to the antennas, and the customer can be provided with a reel of RFID tags that includes no RFID tags that have failed the testing.

DRAWING DESCRIPTIONS

Details of one or more embodiments are set forth in the accompanying drawings and the description below. Other features and advantages may be apparent from the description and drawings, and from the claims.

DETAILED DESCRIPTION

Figure 1:
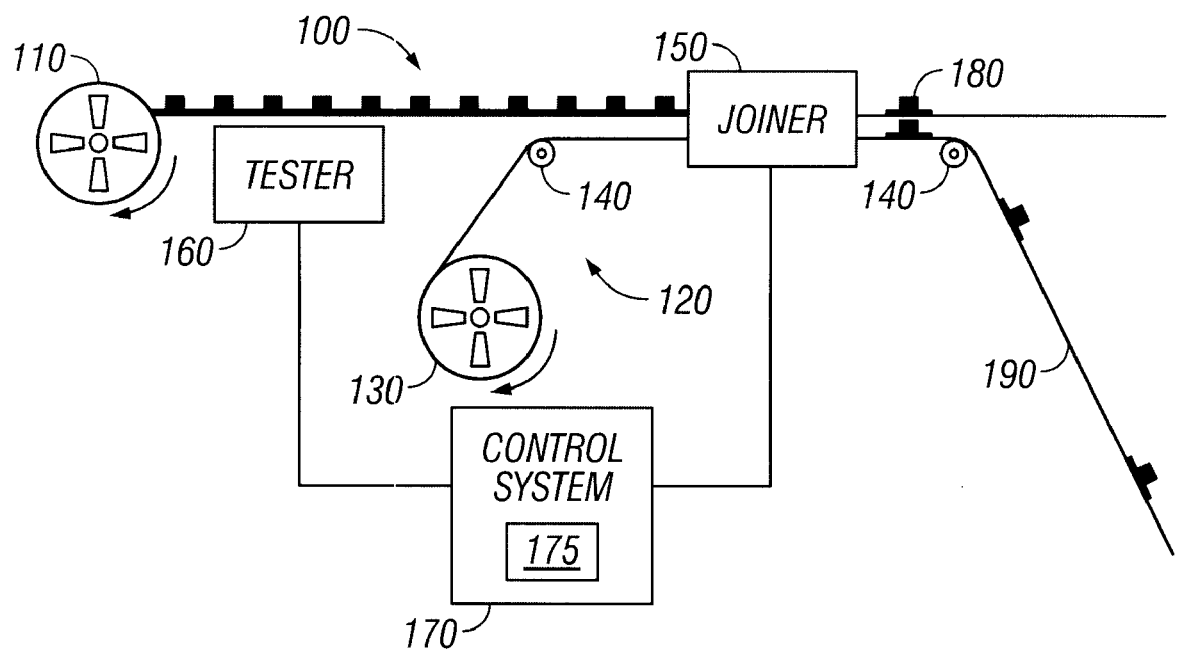
FIG. 1 is a block diagram illustrating an RFID tag assembling system.

FIG. 1 is a block diagram illustrating an RFID tag assembling system. The system can include an RFID module conveyor 100 that moves a substrate having multiple RFID modules. An RFID module can include a conductive pattern and an attached integrated circuit (IC) chip that can include a radio frequency (RF) interface, control logic, and a memory. The module can be connected (capacitive or ohmic) to a tuned antenna to form a tag.

A single RFID module design can be used with multiple styles of tag antennas, and can be programmed for different RFID tag applications. Using the RFID module to attach the RFID chip to an antenna can reduce overall costs and lead to reduced inventory and increased production efficiencies. The RFID modules can be manufactured before the RFID antennas and stored for later use. The RFID module carrying substrate can be a reel-form substrate, and the conveyor can include a reel 110 on which the reel-form substrate is wound. Thus, the RFID modules need only be moved in one processing direction to be tested and attached to the RFID antennas (the one processing direction can include forward and backward motion in multiple actual directions in the three dimensional space of the tag assembling system).

The RFID tag assembling system can also include an RFID antenna conveyor 120 that moves a substrate having multiple RFID antennas. The RFID antenna conveyor can move the RFID antennas with respect to, and into alignment with, the RFID modules so that the RFID modules can be joined with the RFID antennas in an automated assembly process. This automated system that aligns RFID modules with antennas and subsequently joins the two to form RFID tags can significantly reduce RFID tag manufacturing costs, while at the same time providing significant flexibility in RFID tag design and inventory control.

The automated RFID tag assembly system can be a completely mechanical system or can use data processing components as described below. In a fully mechanical system, different gages can be provided to set the system for the different pitch ratios between the RFID modules and the various RFID antennas that can be used. Moreover, the RFID antenna carrying substrate can also be a reel-form substrate, and the RFID antenna conveyor can include a reel 130, on which the reel-form substrate is wound, and multiple redirecting members 140 (e.g., rollers or wheels).

The system can include a joiner 150 that separates the RFID modules from the first substrate and attaches them to the RFID antennas on the second substrate. The joiner 150 can include a cutter, a placement arm, and/or an adhesive applier. Adhesives can be used to bond the separated modules to the antennas, or alternative bonding techniques can be used (e.g., ultrasonic bonding can be used to bond the two plastics together). Moreover, the joiner 150 can assemble RFID tags in parallel, as described further below.

The joiner 150 can include an additional cutter such that an initial cut can be made to partially separate the RFID modules from each other, and a subsequent final cut can be made to fully separate the RFID modules from the substrate and the other modules. Such an initial cut can also be performed earlier in the system and not in the joiner 150. The cutters can employ roller (e.g., steel rolled), stamp, laser, or other cutting techniques. The system can further include a tester 160 that can be used to identify good RFID modules before attachment to the RFID antennas. The first cut can be applied to all the RFID modules, and the second cut can be applied only to the good RFID modules, leaving the bad ones attached to the substrate web for disposal.

The RFID tag assembling system can also include a control system 170, which can be a data processing system (e.g., one or more programmable machines). The control system 170 can include a machine-readable medium 175 embodying information indicative of instructions that can be performed by the control system to result in operations. The medium 175 may be removable and may include a boot media having operating system (OS) instructions and data that are loaded into volatile memory when the system boots up. The medium 175 can be read-only or read/write media and can be magnetic-based (e.g., a hard disk), optical-based (e.g., a laser disk), semiconductor-based media (e.g., an Application Specific Integrated Circuit (ASIC)), or a combination of these.

The control system 170 can be coupled with the conveyors, the tester, and the joiner, and the control system 170 can direct and receive information from all of these. For example, the control system 170 can test the RFID modules using the tester 160 and only attach the good RFID modules to the RFID antennas. Thus, a bad RFID module 180 can be skipped and not attached to its corresponding antenna 190.

Figure 2:
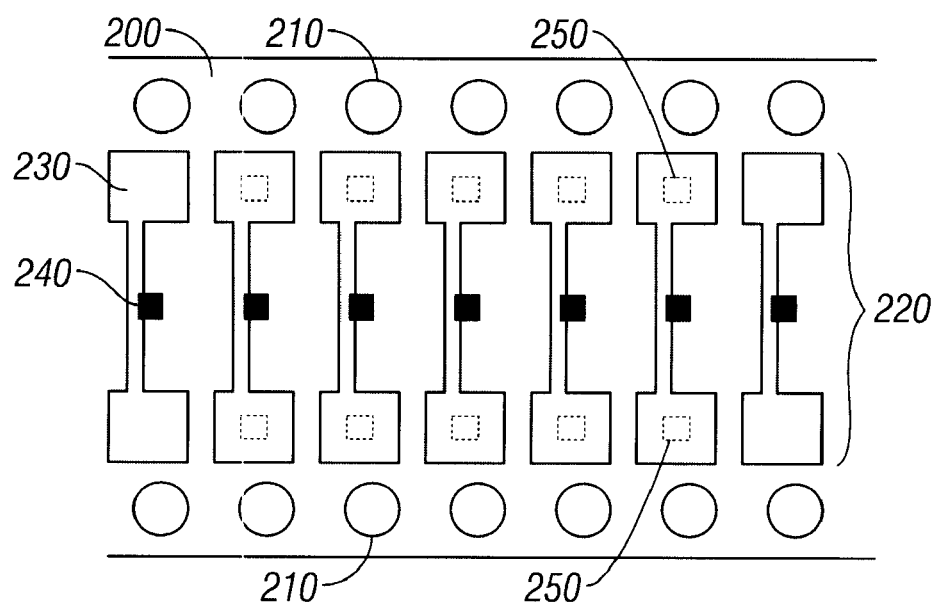
FIG. 2 is a top view of a reel-form substrate having multiple RFID modules in proximity to a tester.
Figure 3:
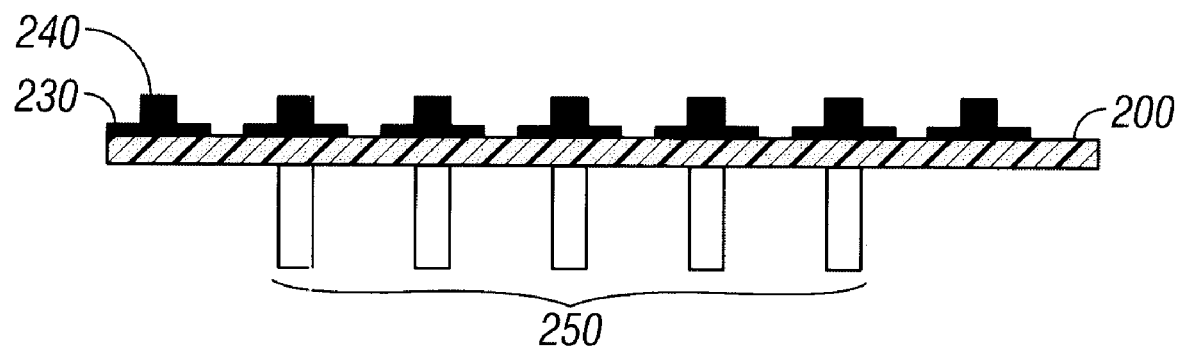
FIG. 3 is a side view of the reel-form substrate having multiple RFID modules in proximity to the tester.

FIG. 2 is a top view of a reel-form substrate 200 having multiple RFID modules 220 in proximity to a tester. FIG. 3 is a side view of the reel-form substrate 200 having multiple RFID modules in proximity to the tester. Each RFID module 220 can include a conductive pattern 230 and a chip 240. Presenting the RFID modules 220 for test can be the initial step in the assembly process. The nature of the testing can be specific to the manufacturer and the planned RFID application, and multiple RFID modules can be tested in parallel in order to increase throughput.

The tester can include test heads 250. The two test heads used for an RFID module can be essentially probes brought up underneath the conductive pattern 230 of the RFID module. The test heads 250 can be conductors that never actually contact the conductive pattern 230, but rather read/interact with the RFID modules through the substrate 200. The reel-form substrate 200 can be made of mylar (e.g., three millimeter PET (Polyethylene Terephthalate) film) and can include sprocket holes 210 for use by a conveyor.

The test heads 250 can emulate the antennas to the RFID modules and fully test the functionality and read distance, and also program the chips without cross-module interference. For example, at a frequency of 2.5 GHz, the test heads 250 in a tester can accurately measure the read distance of the RFID tags to be made from the modules to within plus or minus 1%. Testing the RFID modules in parallel can be done by transmitting the bits to each module simultaneously in a synchronous fashion such as what can be readily adapted to binary search techniques, where all the modules under test are effectively transmitted to at the same time, and the modules respond without interfering with one another. This can significantly increase the rate of RFID modules testing in a system.

Figure 4:
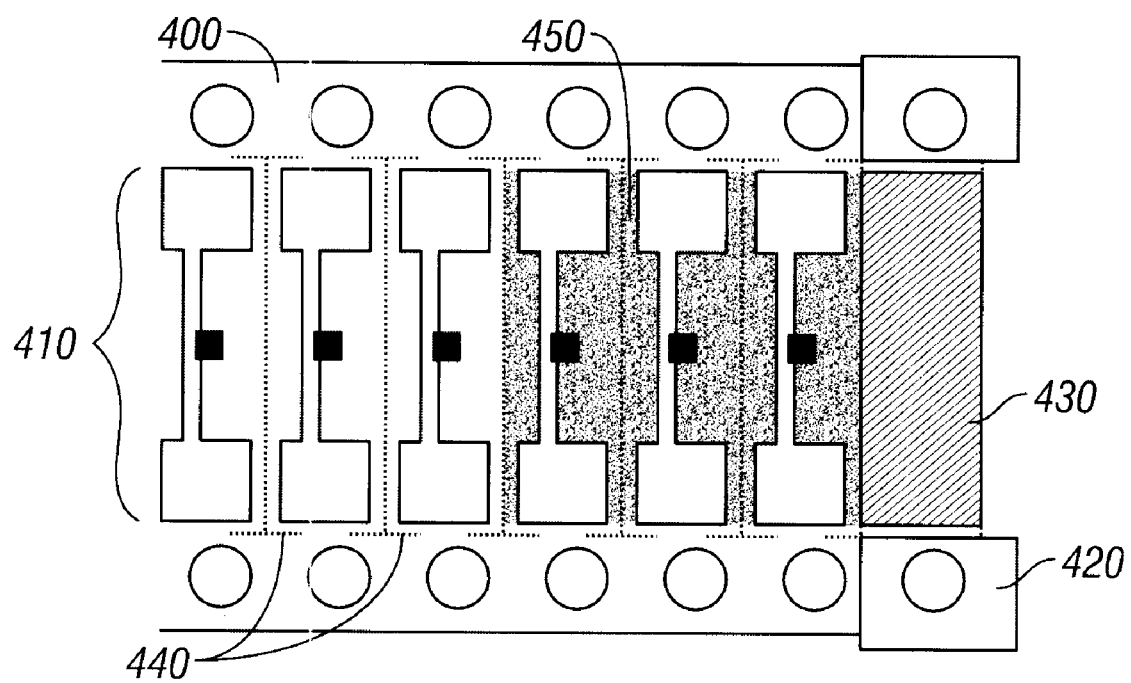
FIG. 4 is a top view of a reel-form substrate having multiple RFID modules in proximity to a joiner.

FIG. 4 is a top view of a reel-form substrate 400 having multiple RFID modules 410 in proximity to a joiner. The joiner can include a sheering tool 420 and a vacuum head 430 used to separate the modules 410 from the substrate 400. Initial cuts 440 can also be made as described above.

Figure 5:
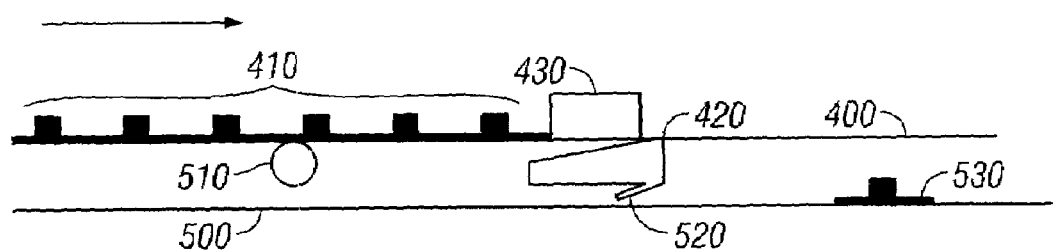
FIG. 5 is a side view of the substrate having the RFID modules and a reel-form substrate having RFID antennas in proximity to the joiner.

An adhesive 450 can be applied to an underside of the substrate 400 and used to bond the modules 410 to RFID antennas. FIG. 5 is a side view of the substrate 400 having the RFID modules 410 and a reel-form substrate 500 having RFID antennas in proximity to the joiner. An adhesive applier 510 (e.g., a roller or a sprayer) can apply the adhesive before the modules are separated and attached to the antennas.

The joiner can also include a placement arm 520. Following the final cut, the placement arm 520 can push the separated module down against the antenna on the reel being fed underneath. The distance traversed in this placement of the module can be around 5 millimeters or less. The vacuum head 430 and sheering tool 420 can move downward cutting the module free and can proceed until the module is in contact with the antenna. A resultant tag 530 formed by combining the module and the antenna is then complete.

Figure 6:
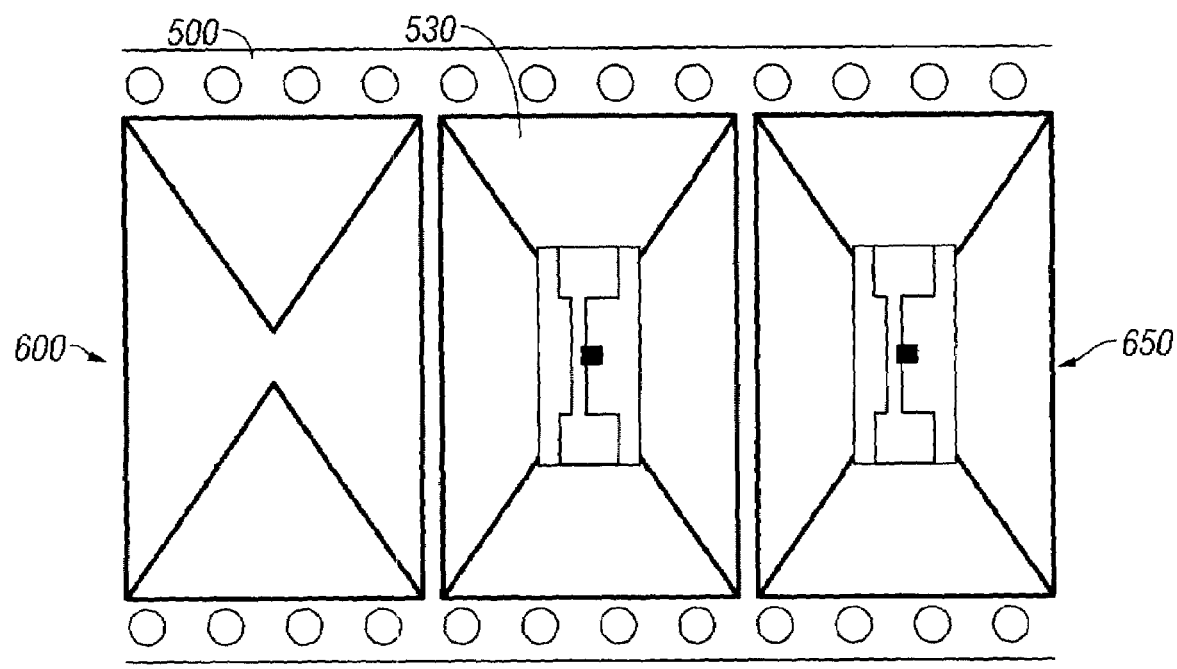
FIG. 6 is a top view of the reel-form substrate having the RFID antennas.

FIG. 6 is a top view of the reel-form substrate 500 having the RFID antennas. An antenna conductive pattern 600 is an example of a bare RFID antenna before attachment of the RFID module. Many types of antenna conductive patterns can be used based on the various RFID applications. An RFID tag 650 shows the RFID module attached to the antenna.

Using these systems and techniques, RFID tags can also be assembled in parallel. An assembly system can be designed to make multiple attachments of modules from the same reel of modules onto a single reel of antennas at substantially the same time, allowing hardware to be shared in the assembly system and potentially reducing total equipment costs. In the system of FIG. 1, the joiner can include multiple joiner units, and the conveyors can be designed to simultaneously align RFID modules and antennas that are not on the same pitch within the multiple joiner units. Moreover, the conveyors can be adjustable to allow for different module to antenna pitch ratios.

Figure 7:
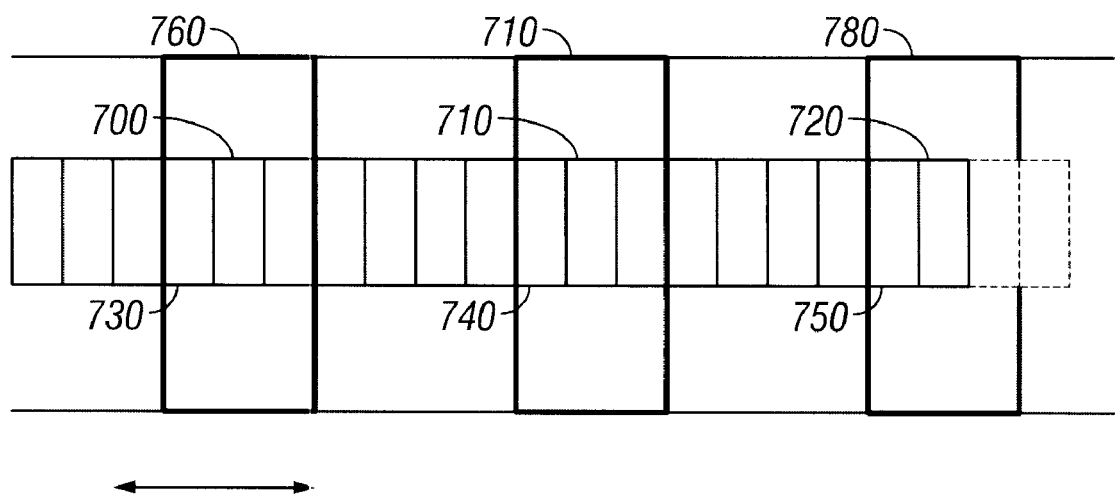
FIGS. 7 and 8 illustrate RFID modules and antennas being aligned for joining in parallel.
Figure 8:
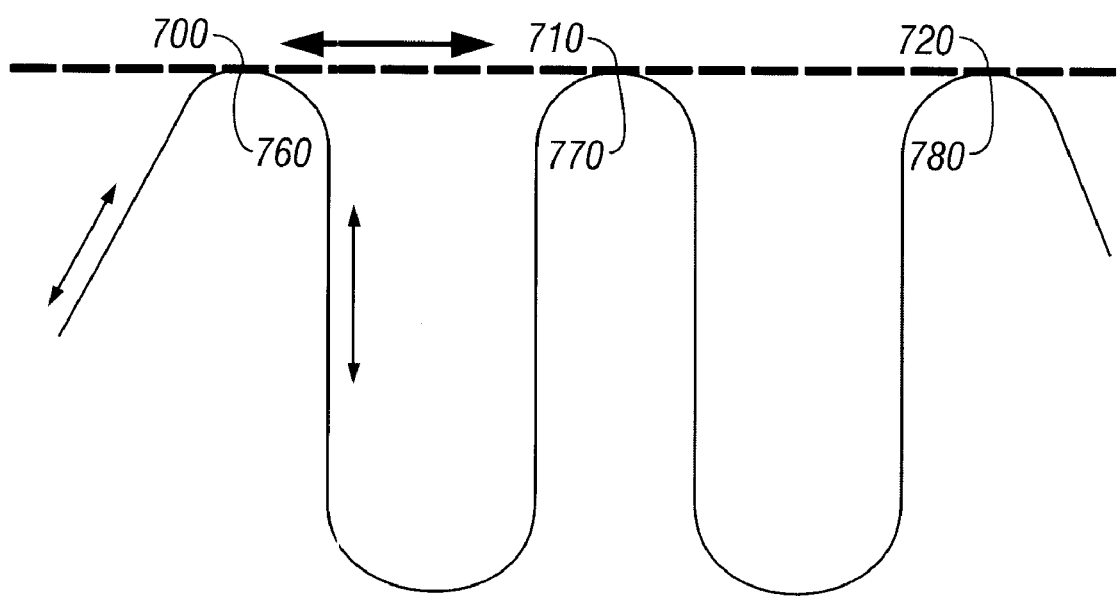

FIGS. 7 and 8 illustrate RFID modules 700, 710, 720 and antennas 760, 770, 780 being aligned for joining in parallel. FIG. 7 shows a top view and FIG. 8 shows a side view, with arrows showing the one processing direction. The RFID modules can be tested and attached in groups, where each joiner handles its proportionate share of the group (e.g., a third of the group per joiner when there are three joiners).

Figure 9:
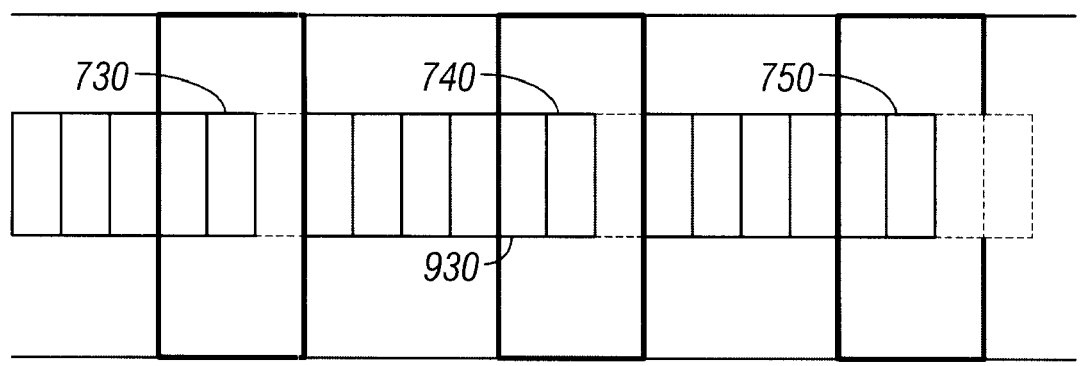
FIGS. 9 and 10 illustrate the aligning system of FIGS. 7 and 8 after a first set of modules have been attached to their respective antennas in parallel.
Figure 10:
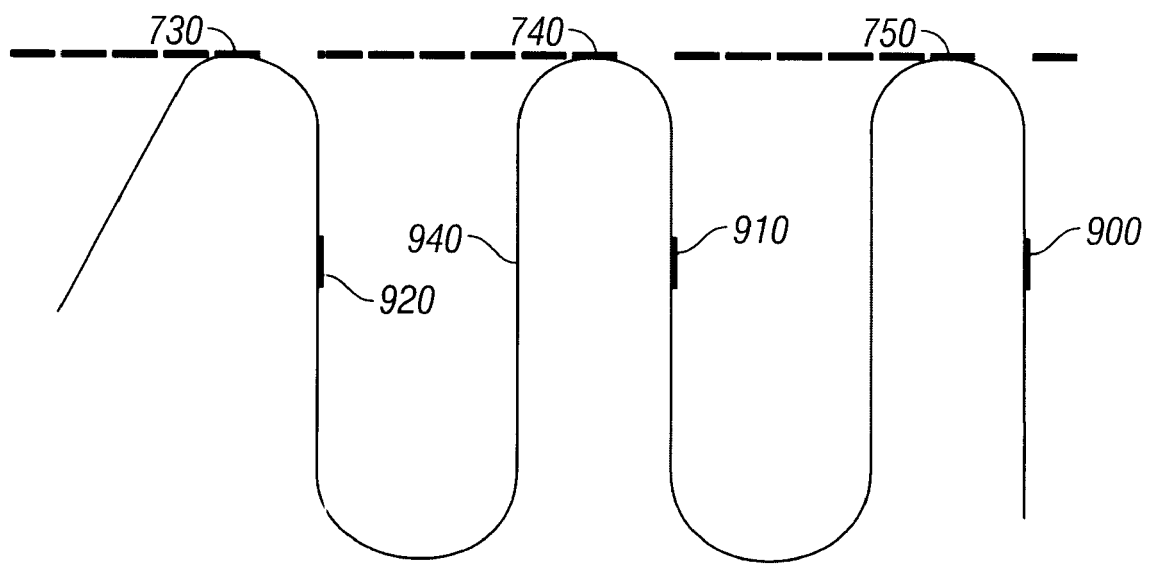

For example, in the system with three joiners, the RFID modules can be handled in groups of twenty-one. Initially, modules #1 (720), #8 (710) and #15 (700) can be placed over corresponding antennas #1 (780), #8 (770) and #15 (760). If all three aligned modules have been identified as good modules, they can all be attached to the antennas in parallel. After attaching the modules, both the modules and the antennas can be advanced one position. Subsequently, modules #2 (750), #9 (740), and #16 (730) can be attached to their respective antennas. This can continue until modules #1 through #21 have been attached. FIGS. 9 and 10 illustrate the aligning system of FIGS. 7 and 8 after a first set of modules have been attached to their respective antennas in parallel. Tags #1 (900), #8 (910) and #15 (920) have been formed. Modules #2 (750), #9 (740), and #16 (730) have been aligned over their respective antennas.

If a module has been found to be faulty, the module need not be attached to the antenna and can remain intact on the module web. Thus, for any failed modules that are not placed, the associated antenna may have no module attached. A number of ways can be used to handle these skipped antennas (these antennas are referred to as skipped even though they may not in fact be skipped over in the processing, as described below).

One approach is to advance, or return, to one of the placement sites where the first good module on the reel of modules will be aligned over the appropriate antenna and attached. As an example, if module #10 (930) is bad, antenna #10 (940) can be positioned over position #1 and module #22 can be attached. Module #23 then becomes the next #1 in the subsequent set of attachments.

Figure 11:
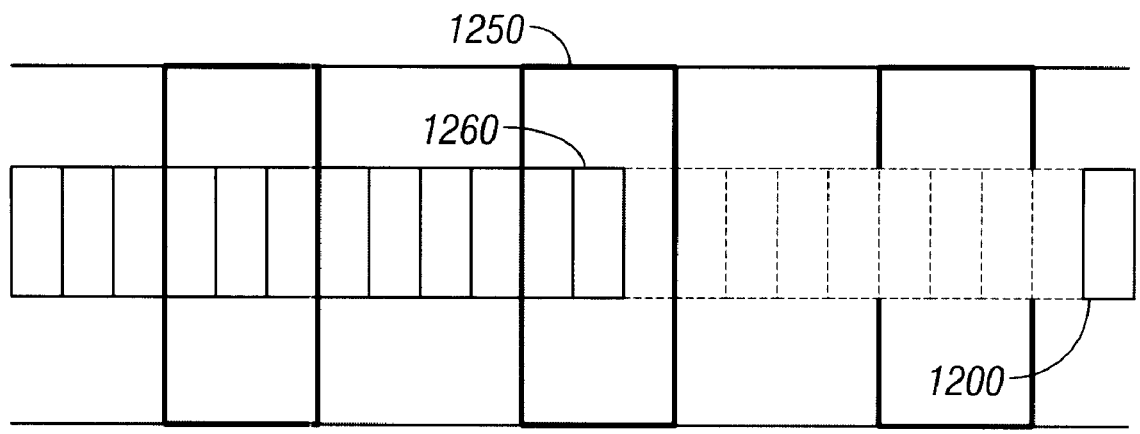
FIGS. 11 and 12 illustrate the aligning system of FIGS. 7 and 8 when a bad module is not attached and a skipped antenna is filled.
Figure 12:
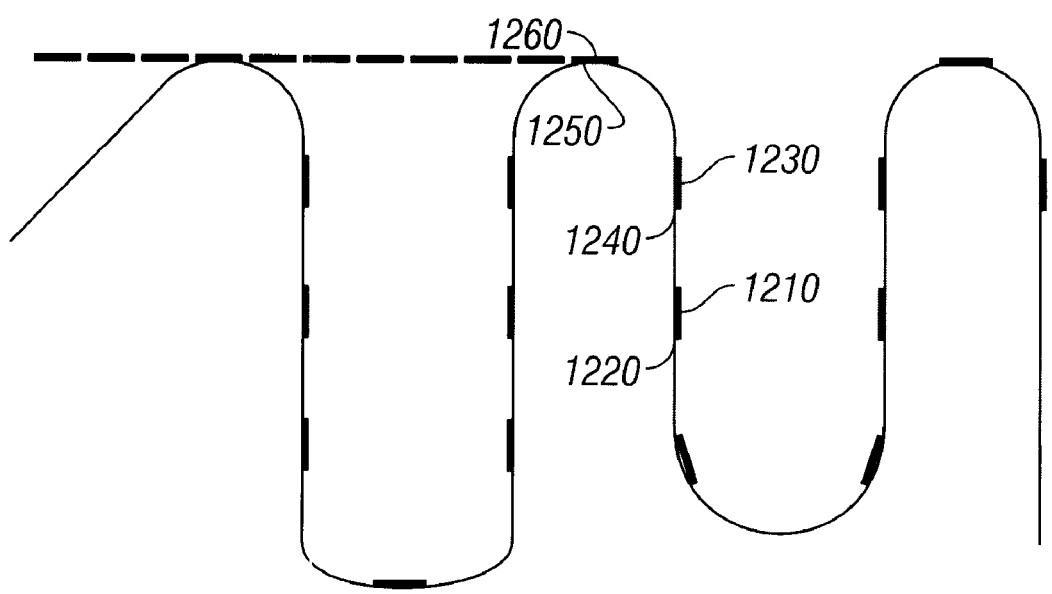

Another approach for filling skipped antennas is to leave the antenna in place and then place the next good module from that set (i.e., the antenna is not in fact skipped). At the end of a set of the seven placements, the next set of good modules can be advanced to the appropriate antenna and placed. As an example, FIGS. 11 and 12 illustrate the aligning system of FIGS. 7 and 8 when a bad module is not attached and a skipped antenna is filled. If module #12 (1200) was bad, module #13 (1210) can then be attached to antenna #12 (1220). Then module #14 (1230) can be attached to antenna #13 (1240). Subsequently, antenna #14 (1250) can receive module #22 (1260). Once the repairs have been completed, the next set of twenty-one modules and antennas can be positioned to start the sequence again. The entire process can then be repeated.

Additionally, instead of three joiner units, more or less can be used. Additional joiners operating in parallel can increase throughput, although the overall complexity of the system likely increases as well. Failed modules can cause a decrease in throughput of the system, and the number of joiners and the size of the module batches can be adjusted based on expected failure rates. Typically, modules yields of at least 95% can be expected.

Figure 13:
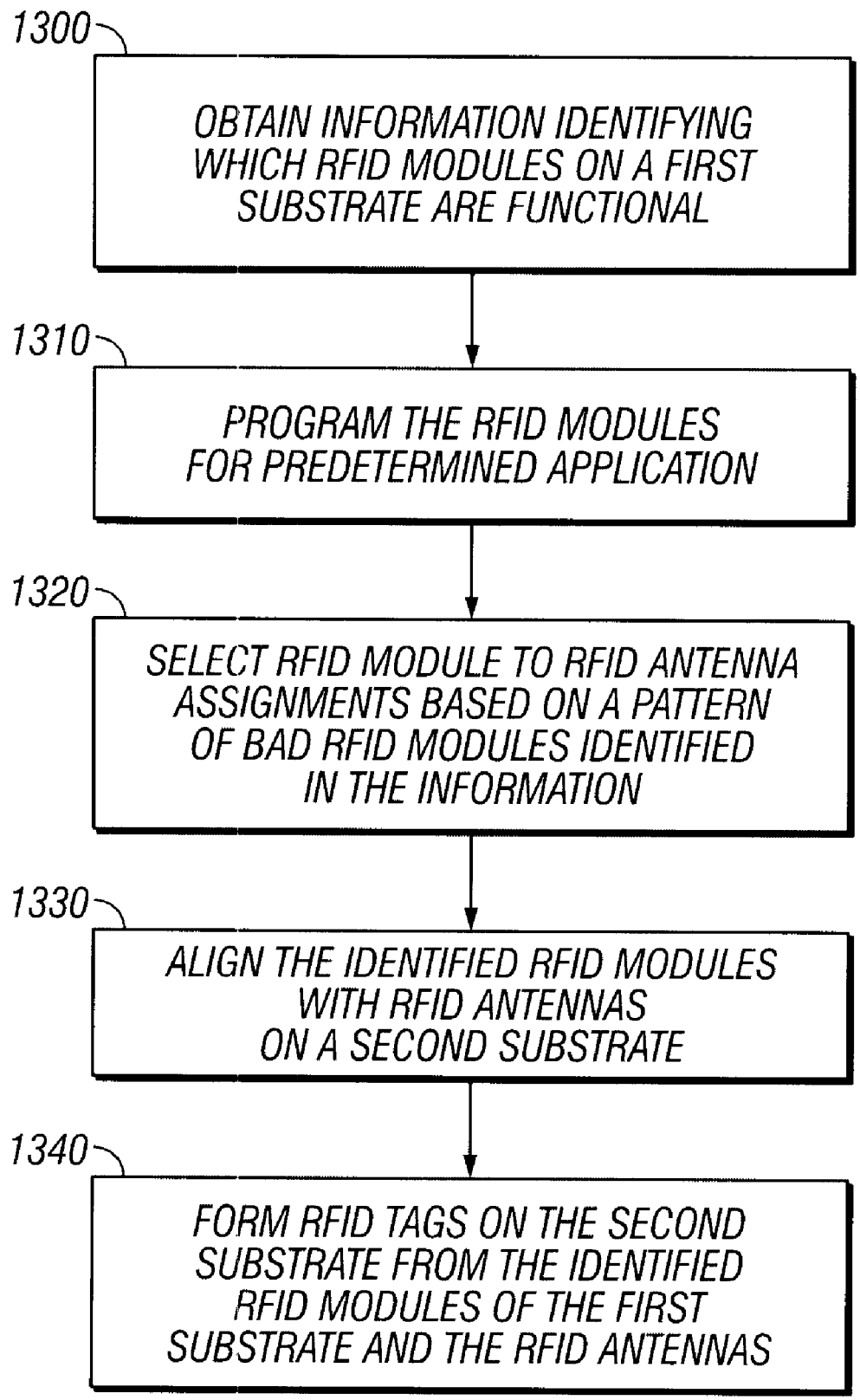
FIG. 13 is a flow chart illustrating a process of assembling RFID tags.

FIG. 13 is a flow chart illustrating a process of assembling RFID tags. Information identifying which RFID modules on a first substrate are functional can be obtained at 1300. Obtaining the information identifying functional RFID modules can involve testing the RFID modules, as described above, reading indicators proximate to the modules (e.g., optically scanning for visual marks placed on or near bad modules in a prior testing process), or receiving the information from another source. Testing the modules can involve testing RFID modules on a first reel-form substrate, which can be done in parallel, to identify the RFID modules that are fully functional for a predetermined application. Moreover, the RFID modules can be programmed for the predetermined application at 1310.

RFID module to RFID antenna assignments can be selected at 1320 based on a pattern of bad RFID modules identified in the information. In general, the locations of bad RFID modules can be expected to be random, and this can assist in the efficiency of the assignment of modules to antennas. By looking ahead at a group of modules to be placed, a determination can be made as to the best way to handle skipped antennas. For example, with an expected module yield of 97%, two joiners can be used to place modules in batches of forty, resulting in an expectation of one to two bad modules per batch. If the upcoming batch has bad modules in positions #3 and #25, the skipped antenna #3 can be filled with module #4 and so on, until the two bad modules cancel each other out, and modules #6 and #26 get placed on antennas #5 and #25, respectively, in parallel. Likewise, if the upcoming batch of forty has one bad module in position #17, antenna #17 can be skipped and later filled with module #41, making module #42 the new #1 in the following batch.

In addition, the system can be built to allow a differential alignment between the modules and antennas for the multiple joiners. Thus, in the example above, module #4 can be aligned and placed on antenna #3 simultaneously with module #23 being aligned and placed on antenna #23. This differential alignment can then go back to a normal alignment once modules #6 and #26 are reached.

The identified good RFID modules can be aligned with RFID antennas on a second substrate at 1330. This can be done in parallel using reel-form substrates, as described. RFID tags can then be formed on the second substrate from the identified FRID modules of the first substrate and the RFID antennas at 1340. This can also be done in parallel using reel-form substrates. Moreover, the reel-form substrates can have RFID modules and RFID antennas side-by-side.

Figure 14:
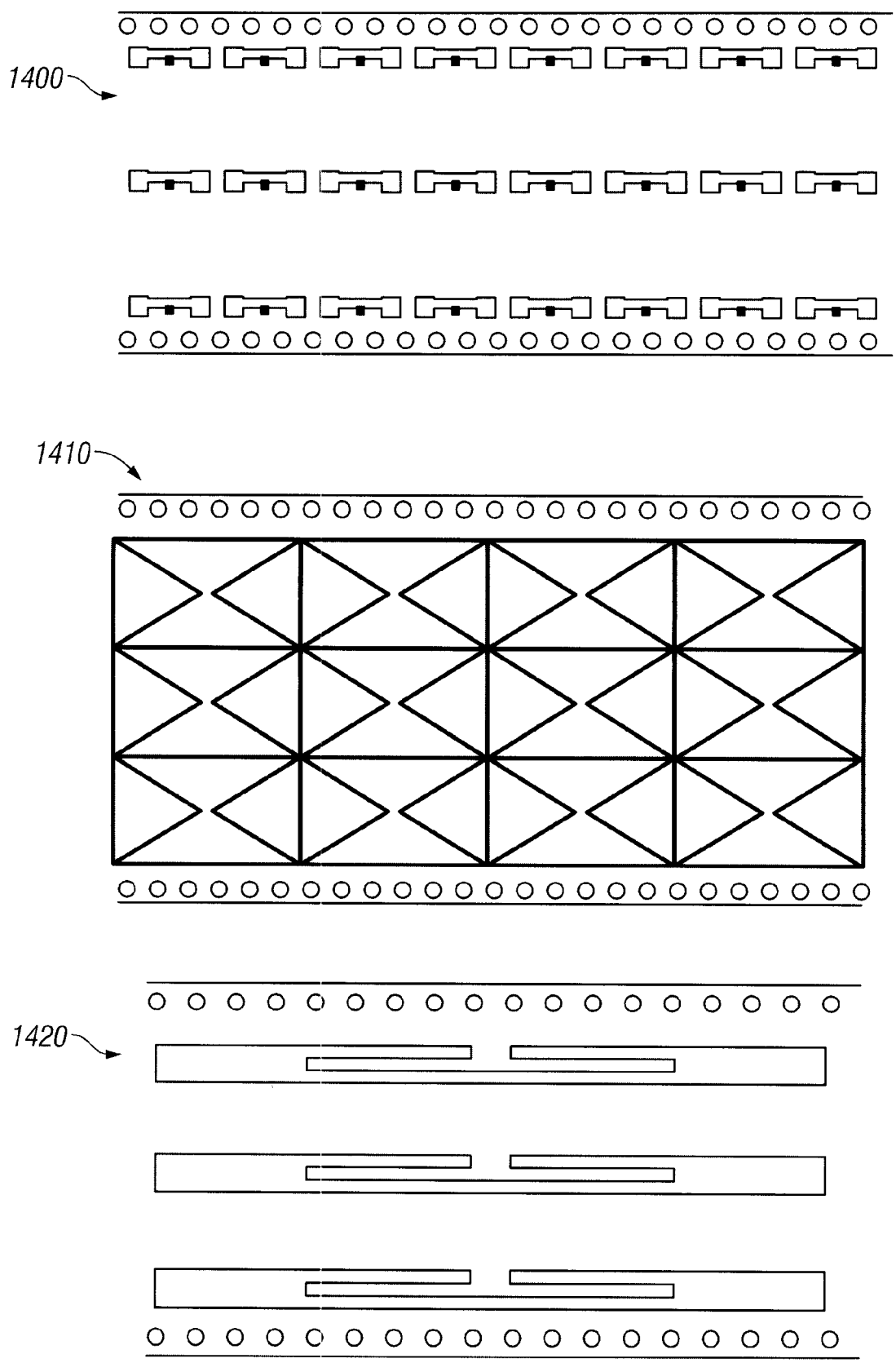
FIG. 14 illustrates an example of reel-form substrates with side-by-side RFID modules and RFID antennas.

FIG. 14 illustrates an example of reel-form substrates with side-by-side RFID modules and RFID antennas. A reel-form substrate 1400 has multiple RFID modules, three across. A corresponding reel-form substrate 1410 has multiple RFID antennas, three across, that line up with the RFID modules. Another corresponding reel-form substrate 1420 has different RFID antennas, three across, that line up with the RFID modules. Thus, another way to assemble the RFID tags in parallel can be to widen the reel-form substrates and place more modules and antennas side-by-side on the substrates. Multiple side-by-side RFID modules can be attached to the antennas simultaneously, and when a bad RFID module is skipped, the corresponding antenna can have a subsequent RFID module in the same row of modules attached. Moreover, the FRID module to RFID antenna assignments can be selected based on a pattern of bad RFID modules identified in the information.

The reel-form substrates having RFID modules described herein can be manufactured using the systems and techniques described in U.S. patent application entitled, "CHIP ATTACHMENT IN AN RFID TAG", application Ser. No. 10/396,932, filed Mar. 25, 2003, which is hereby incorporated by reference. This manufacturing of the RFID modules on the reel-form substrate can be done separately or in a system that combines the systems and techniques described herein with the systems and techniques described in the CHIP ATTACHMENT IN AN RFID TAG application.

Various implementations of the systems and techniques described here may be realized in digital electronic circuitry, integrated circuitry, specially designed ASICs, computer hardware, firmware, software, and/or combinations thereof.

These various implementations may include implementation in one or more programs that are executable and/or interpretable on a programmable system including at least one programmable processor, which may be special or general purpose, coupled to receive data and/or instructions from, and to transmit data and/or instructions to, a storage-memory, at least one input device, and at least one output device.

These programs (also known as computer programs, software, software applications or code) include machine instructions for a programmable processor, and may be implemented in a high-level procedural and/or object-oriented programming language, and/or in assembly/machine language. As used herein, the term "machine-readable medium" refers to any software product, computer program product, apparatus and/or device (e.g., magnetic-based storage, optical-based storage, memory, Programmable Logic Devices (PLDs)) used to provide machine instructions and/or data to a programmable processor, including a machine-readable medium that receives machine instructions as a machine-readable signal.

The logic flow depicted in FIG. 13 does not require the particular order shown, or sequential order, to achieve desirable results. Other embodiments may be within the scope of the following claims.

What is claimed is:

1. A radio frequency identification (RFID) tag assembling system comprising:
   an RFID module conveyor that moves a first substrate having multiple RFID modules;
   an RFID module tester in proximity to the RFID modules;
   an RFID antenna conveyor that moves a second substrate having multiple RFID antennas;
   a joiner in proximity to the first and second substrates; and
   a control system coupled with the conveyors and the tester and comprising a machine-readable medium embodying information indicative of instructions that when performed by the control system results in operations comprising
   moving the first substrate with respect to the tester,
   identifying good RFID modules using the tester,
   aligning the good RFID modules with the RFID antennas, and
   forming RFID tags from the good RFID modules and the RFID antennas.

2. The system of claim 1, wherein the joiner further comprises an adhesive applier.

3. The system of claim 1, wherein the joiner comprises a vacuum head, a sheering tool, and a placement arm.

4. The system of claim 1, wherein the RFID module tester comprises multiple heads to test multiple RFID modules per test operation.

5. The system of claim 1, further comprising an adhesive applier in proximity to the RFID modules.

6. The system of claim 1, wherein the joiner comprises a cutter in proximity to the first substrate, aligning the good RFID modules comprises aligning the good RFID modules and the RFID antennas with respect to the cutter, and forming the RFID tags comprises separating the good RFID modules from the first substrate using the cutter.

7. The system of claim 1, wherein the first substrate comprises a reel-form substrate.

8. The system of claim 7, wherein the RFID antenna conveyor comprises multiple redirecting members that feed the second substrate into a curved path allowing two or more of the RFID modules to be aligned with two or more of the RFID antennas per alignment operation.

9. The system of claim 8, wherein aligning the good RFID modules with the RFID antennas comprises aligning a skipped RFID antenna with a next available good RFID module following a passed-over bad RFID module.

10. The system of claim 9, wherein aligning and forming is performed in batches, and the next available good RFID module is selected from a next batch following a batch having the bad RFID module.

11. The system of claim 8, wherein aligning the good RFID modules with the RFID antennas comprises aligning a next available good RFID module with an RFID antenna when a bad RFID module is passed over.

12. The system of claim 7, wherein the reel-form substrate has two or more RFID modules side-by-side.

13. A method comprising:
   obtaining information identifying which RFID modules on a first reel-form substrate are functional;
   selecting RFID module to RFID antenna assignments based on a pattern of bad RFID modules identified in the information;
   aligning the identified RFID modules with RFID antennas on a second reel-form substrate; and
   forming RFID tags on the second reel-form substrate from the identified RFID modules of the first reel-form substrate and the RFID antennas;
   wherein aligning and forming comprises aligning and forming the RFID tags in parallel.

14. The method of claim 13, wherein the first and second reel-form substrates have RFID modules and RFID antennas side-by-side.

15. A method comprising:
   obtaining information identifying which RFID modules on a first reel-form substrate are functional;
   aligning the identified RFID modules with RFID antennas on a second reel-form substrate; and
   forming RFID tags on the second reel-form substrate from the identified RFID modules of the first reel-form substrate and the RFID antennas;
   wherein aligning and forming comprises aligning and forming the RFID tags in parallel;
   wherein aligning and forming the RFID tags in parallel comprises differentially aligning and forming the RFID tags in response to identified bad modules.

16. The method of claim 15, wherein obtaining the information identifying functional RFID modules comprises testing the RFID modules on the first reel-form substrate to identify the RFID modules that are fully functional for a predetermined application.

17. The method of claim 16, further comprising programming the RFID modules for the predetermined application.

18. The method of claim 16, wherein testing the RFID modules comprises testing the RFID modules in parallel.

19. A machine-readable medium embodying information indicative of instructions that when performed by one or more machines result in operations comprising:
   obtaining information identifying which RFID modules on a first reel-form substrate are functional;
   selecting RFID module to RFID antenna assignments based on a pattern of bad RFID modules identified in the information;
   aligning the identified RFID modules with RFID antennas on a second reel-form substrate; and
   forming RFID tags on the second reel-form substrate from the identified RFID modules of the first reel-form substrate and the RFID antennas;

wherein aligning and forming comprises aligning and forming the RFID tags in parallel.

20. The machine-readable medium of claim 19, wherein the first and second reel-form substrates have RFID modules and RFID antennas side-by-side.

21. A machine-readable medium embodying information indicative of instructions that when performed by one or more machines result in operations comprising:
obtaining information identifying which RFID modules on a first reel-form substrate are functional;
aligning the identified RFID modules with RFID antennas on a second reel-form substrate; and
forming RFID tags on the second reel-form substrate from the identified RFID modules of the first reel-form substrate and the RFID antennas;
wherein aligning and forming comprises aligning and forming the RFID tags in parallel;
wherein aligning and forming the RFID tags in parallel comprises differentially aligning and forming the RFID tags in response to identified bad modules.

22. The machine-readable medium of claim 21, wherein obtaining the information identifying functional RFID modules comprises testing the RFID modules on the first reel-form substrate to identify the RFID modules that are fully functional for a predetermined application.

23. The machine-readable medium of claim 22, wherein the operations further comprise programming the RFID modules for the predetermined application.

24. The machine-readable medium of claim 22, wherein testing the RFID modules comprises testing the RFID modules in parallel.

* * * * *